United States Patent
Meihong et al.

(10) Patent No.: US 7,151,694 B2
(45) Date of Patent: Dec. 19, 2006

(54) INTEGRATED CIRCUIT MEMORY WITH FAST PAGE MODE VERIFY

(75) Inventors: Zhu Meihong, Jiangsu (CN); Wang Jing, Jiangsu (CN); Yang Nien Chao, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 56 days.

(21) Appl. No.: 11/141,953

(22) Filed: Jun. 1, 2005

(65) Prior Publication Data

US 2005/0276129 A1 Dec. 15, 2005

Related U.S. Application Data

(60) Provisional application No. 60/579,359, filed on Jun. 14, 2004.

(51) Int. Cl.
G11C 11/34 (2006.01)
(52) U.S. Cl. .......................... 365/185.22; 365/185.22; 365/200
(58) Field of Classification Search .......... 365/185.22, 365/185.12, 200
See application file for complete search history.

(56) References Cited

U.S. PATENT DOCUMENTS

| | | | |
|---|---|---|---|
| 5,638,326 A | 6/1997 | Hollmer et al. | |
| 5,742,543 A | 4/1998 | Fazio | |
| 5,748,535 A * | 5/1998 | Lin et al. | 365/185.22 |
| 5,835,414 A | 11/1998 | Hung et al. | |
| 5,903,497 A * | 5/1999 | Yu et al. | 365/185.22 |
| 5,912,845 A | 6/1999 | Chen et al. | |
| 5,999,451 A * | 12/1999 | Lin et al. | 365/185.11 |
| 6,065,090 A | 5/2000 | Deas | |
| 6,122,197 A | 9/2000 | Sinai et al. | |
| 6,147,910 A * | 11/2000 | Hsu et al. | 365/185.25 |
| 6,496,417 B1 | 12/2002 | Shiau et al. | |
| 6,643,794 B1 | 11/2003 | Utsugi | |
| 2002/0167843 A1 | 11/2002 | Hsia et al. | |
| 2004/0027866 A1 | 2/2004 | Tomita et al. | |

OTHER PUBLICATIONS

Macronix International Co., Ltd., MX26L12811MC—128M[x8/x16] Single 3V Page Mode MTP Memory, Macronix Product Specification Rev. 1, Oct. 29, 2003, 32 pages.
Macronix International Co., Ltd., MX26L25722—256M[x16/x32] Single 3V Page Mode eLiteFlash™ Memory, Macronix Product Specification Rev. 1,0 May 27. 2004, 32 pages.

* cited by examiner

Primary Examiner—Anh Phung
(74) Attorney, Agent, or Firm—Mark Haynes; Haynes Beffel & Wolfeld (57) ABSTRACT

A method for operating an integrated circuit memory device includes applying a verify procedure in which the page of data and one or more bits from a set of replacement cells are matched with a pattern in parallel to indicate a verify result, where the page of data is "unrepaired" and may include one or more bits from defective bit lines. While matching to indicate a verify result, the one or more bits from defective bit lines in the page are masked. Flash memory and other memory devices implement the method.

28 Claims, 6 Drawing Sheets

INTEGRATED CIRCUIT MEMORY WITH FAST PAGE MODE VERIFY

RELATED APPLICATION

The present application claims benefit of U.S. provisional application No. 60/579,359, filed on 14 Jun. 2004.

BACKGROUND OF THE INVENTION

1. Field of the Invention

The present invention relates generally to memory devices and more particularly to a nonvolatile memory device having a page read operation.

2. Description of Related Art

Nonvolatile memory devices typically include a memory array comprising memory cells that maintain their data even when electrical power has been removed from the device. There are a variety of types of nonvolatile memory devices. One type includes so-called "read only memory," like mask ROM in which the data is stored in the memory cell by implanting impurities in the channel region of MOS transistors. The data stored in mask ROM devices, and other nonvolatile read only memory devices, cannot be changed in the field. Another type of nonvolatile memory device includes electrically erasable and programmable memory cells, such as flash memory. The data stored in flash memory cells, and other nonvolatile electrically erasable and programmable memory cells, can be changed in the field using electronic programming and erasing procedures. Representative flash memory technologies include floating gate memory cells and charge trapping memory cells such as SONOS, NROM, PHINES and the like.

There are a variety of biasing procedures that are used for programming and erasing memory cells in flash memory. The biasing procedures for floating gate memory cells and charge trapping memory cells cause tunneling of electrons and/or holes into and out of the floating gates or charge trapping structures. The concentration of charge held in the floating gates or the charge trapping structures has an effect on the threshold voltage of the memory cell. Thus, by controlling the amount of charge held in the floating gates or in the charge trapping structures, the threshold voltage of the memory cell can be set, and data stored.

Because of variations in memory cell characteristics, variations in voltages applied, and variations in other parameters across an array, the biasing procedures used for programming and erasing operations in flash memory can result in nonuniform levels of charge stored in the cells distributed across the array. Therefore, the biasing procedures applied in many devices include a sequence of programming or erasing pulses with verify operations between each pulse, or between each set of pulses. A typical verify process includes driving word line voltages to program verify or erasing verify levels, which are changed slightly from the standard read level in order to provide program or erase margin. Then, data is sensed one byte or one word at a time from the memory cells to determine whether each cell has been successfully programmed or erased. If the verify process fails, then retry program or erase pulses are applied iteratively until a successful verify is achieved, or a maximum number of retries is reached.

For many types of flash memory, the erase process is executed on relatively large sectors of memory cells at a time. In some devices, the erase process includes a pre-program operation over the entire sector, followed by an erase operation over the entire sector, and then followed by a so-called soft program process over the entire sector. In some cases, verify operations are also executed after soft program processes. Background information showing erase and program operations with verify can be found in U.S. Pat. Nos. 6,496,417 and 5,912,845. The verify operations for these types of devices require that all of the words in the sector be verified in sequence. This verify operation is quite time-consuming, and contributes a large proportion of time to the overall erase timing for the device.

Due to demand for faster access times combined with large, high-density arrays for flash memory, page read and burst read flash memories have been developed. In normal flash memory, the read operation is executed word by word so that within a specified time, such as time after address transition (TAA of for example 100 ns to 70 ns or less) or time after a chip enable signal (TCE), only one 16-bit word is addressed, its contents sensed, and its data output. In page mode devices, the output structure for the array is set up to provide for addressing more than one word at a time, such as four words (64 bits) or more, within the TAA or TCE time. The multi-word page of data is sensed in parallel out of the array, and stored in sense amplifiers or in page buffers. Data stored in the sense amplifiers or page buffers can be read out in burst mode or otherwise with very short cycle times, that are not directly limited by the TAA or TCE times of the flash memory array.

To further improve speed of operation of flash memory devices, page mode flash devices have been developed which support page programming in addition to page reading. To program a page in the array, a page buffer is loaded with data to be programmed, by transferring data into bit latches in the page buffer, and programming the page with each bit line being controlled by the data in the corresponding bit latch. A verify procedure for page mode programming can include automatically clearing bit latches in the page buffer which are successfully programmed, in a parallel operation. The data stored in the page buffer is then read byte-by-byte to confirm that all bits have been cleared to indicate a successful page program operation. See for example, U.S. Pat. No. 5,835,414 by Hung; and U.S. Pat. No. 5,638,326 by Hollmer. In the just cited patent by Hung, the data is sensed and stored in the page buffer and then judged (by comparison to an all ones or all zeros pattern) in parallel using a match circuit that produces a signal (AL-BRES1) indicating when all bit latches in the page buffer have been reset. This process can reduce the speed of the verify operations significantly, by eliminating the requirement that each byte stored in the page mode sense amplifiers, or in bit latches of the page buffer, be read one by one for the judgment step in the verify procedure.

However, as the size of memory arrays increases, the likelihood of defects in the array increases. To address the likelihood of defects, redundancy techniques have been developed. According to typical redundancy techniques, a redundant array is included on the integrated circuit device, including a redundant set of sense amplifiers. When a defective cell is found in the main array, a replacement cell from the redundant array is used in its place. Addressing signals and output paths are rerouted to access the replacement cell automatically during operation of the device. See, U.S. Pat. No. 6,065,090 by Deas and U.S. Pat. No. 6,643,794 by Utsugi for background information. The new routing for replacement cells creates difficulties for page mode verify operations. In particular, where the verify operation is coupled with the page mode sense amplifiers or page buffers in the array, accurate results cannot be obtained without rerouting results from a replacement cell into the page mode sense amplifiers or page buffers. Such rerouting could alter the timing characteristics for the sensing operation by several nanoseconds, or amounts that are not acceptable for high-performance devices. Another alternative-would require the verify operation for page mode devices to be executed word by word after the data has been repaired and selected for output using an output multiplexer. The replacement cell output can be mapped into the output multiplexer more easily, without seriously affecting timing of the sensing operation. However, the judgment step in the verify operation in this case fails to take advantage of page mode operation, slowing down the overall program and erase timing characteristics for the device.

It is desirable therefore to provide a page mode memory architecture which supports redundancy and high-speed verify operations in support of program and erase procedures.

SUMMARY OF THE INVENTION

A method for operating an integrated circuit memory device as described herein includes applying a verify procedure in which the page of data and one or more bits from a set of replacement cells are matched with a pattern in parallel to indicate a verify result, where the page of data is "unrepaired" and may include one or more bits from defective bit lines. While matching to indicate a verify result, the one or more bits from defective bit lines in the page are masked. In this way, bits from the replacement cells need not be routed into the circuitry that performs the matching operation. The verify operation can therefore take advantage of page mode sensing, improving the overall program and erase speeds for the device.

Embodiments of the method include applying a biasing procedure to program or erase a page or a sector of memory cells and a memory array; sensing a page of data from the page or sector on a plurality of bit lines in the memory array and one or more bits from a set of replacement cells in parallel, wherein one or more bit lines in the plurality of bit lines is marked defective; and matching the page of data and the one or more bits with a pattern in parallel to indicate a verify result, while masking data from one or more bit lines marked defective. In embodiments of the method, the pattern can be changed. For example, a pattern of all 1's can be applied for a pre-program operation, a pattern of all 0's can be applied for an erase operation, and an arbitrary pattern applied for a program operation.

For a flash memory device where an erase procedure includes pre-programming, embodiments of the invention provide a sector pre-program and erase operation. In the sector pre-program and erase operation, a process can be executed, such as the following:

applying pre-program bias voltages to cells in a sector of the array, and to one or more cells in the set of replacement cells, to program the sector to a pre-program pattern;

verifying the sector pre-program pattern by sequencing through pages in the sector by applying a program verify bias voltage to a word line for a current page in the sector and to the one or more cells in the set of replacement cells, and if the verify result indicates a match with the pre-program pattern, then proceeding to a next page until all pages in the sector pass verify, and if the verify result does not indicate a match on the current page, then retrying the step of applying program bias voltages until a match is indicated before proceeding to the next page, or until a maximum number of retries is reached indicating failure;

if pre-programming is successful, then applying erase bias voltages to cells in the sector of the array, and to one or more cells in the set of replacement cells, to erase the sector to an erase pattern; and verifying the sector erase pattern by sequencing through pages in the sector by applying an erase verify bias voltage to the word line for the current page in the sector and to the one or more cells in the set of replacement cells, and if the verify result indicates a match with the erase pattern, then proceeding to a next page until all pages in the sector pass verify, and if the verify result does not indicate a match on the current page, then retrying the step of applying erase bias voltages until a match is indicated before proceeding to the next page, or until a maximum number of retries is reached indicating failure.

Embodiments include a word programming operation, based on applying a biasing procedure to program a selected word within a page, and the pattern comprises data to be programmed. For byte or word mode programming, the process includes masking data in the page that is outside the selected byte or word during the matching.

Embodiments of the invention include integrated circuits, including single chip embodiments, comprising an array of memory cells, such as floating gate cells or charge trapping cells. A set of replacement cells is included that is configured to provide replacement for defective memory cells in the array. Sense circuitry which senses a page of data in parallel from the array, and which senses one or more bits from the set of replacement cells is coupled to the array and to the set of replacement cells. Match circuitry is coupled to the sense circuitry. The match circuitry determines in parallel whether unrepaired bits in the page combined with one or more bits from the set of replacement cells match a pattern, such as all 1's or all 0's. The match circuitry masks bit lines coupled to defective cells in the array, while performing the match. Embodiments of the invention provide for changing the pattern used by the match circuitry for erase, pre-program and program operations. Sense circuitry can be implemented for example using self-sensing page buffers, page buffers in combination with sense amplifiers, or sets of sense amplifiers arranged in parallel for sensing a page at a time. Typical embodiments also include logic for controlling execution of read, program, and erase operations in the array. Erase operations in some embodiments include pre-program and erase operations as described above.

Embodiments of the match circuitry described herein for each bit in a page include logic to indicate whether bit line from which a corresponding data bit is sensed is defective, logic to compare the data bit with a bit from the pattern to produce a comparison result, and logic to force the comparison result to indicate a match if the corresponding bit line is defective. Embodiments of the match circuitry also support programming a selected byte or word within a page, including logic to force the comparison result for bits outside the selected byte or word to indicate a match.

Embodiments of the integrated circuits also include an output multiplexer coupled to the sense circuitry which selects words from the page, and replaces bits in the words sensed from defective bit lines with replacement bits from the set of replacement cells for output by the multiplexer.

Thus, technology is described herein that enables verify operations using unrepaired data, before bits from replacement cells on the array have been substituted for bits from defective bit lines in the array. The technology significantly reduces the time required for erase operations in flash memory integrated circuits, and is otherwise useful for improving performance of integrated circuit memory devices.

Other aspects and advantages of the present invention can be seen on review of the drawings, the detailed description and the claims, which follow.

DETAILED DESCRIPTION

A detailed description of embodiments of the present invention is provided with reference to the FIGS. 1–7.

As used herein, the term "bit line" refers to a conductor extending along a column in the array used during access to memory cells along the column, while the term "data line" more generally refers to a bit line and other types of lines carrying data, such as lines on the outputs of sense amplifiers, column select lines and data multiplexers. Bit lines are defective when data sensed from memory cells using the bit line is unreliable. In typical memory devices including redundant arrays of replacement cells, bit lines are marked defective by storing addresses on the chip as indicators that identified bit lines are defective. Attempts to access memory cells using the defective bit lines are diverted to the redundant array in response to the stored addresses.

Figure 1:
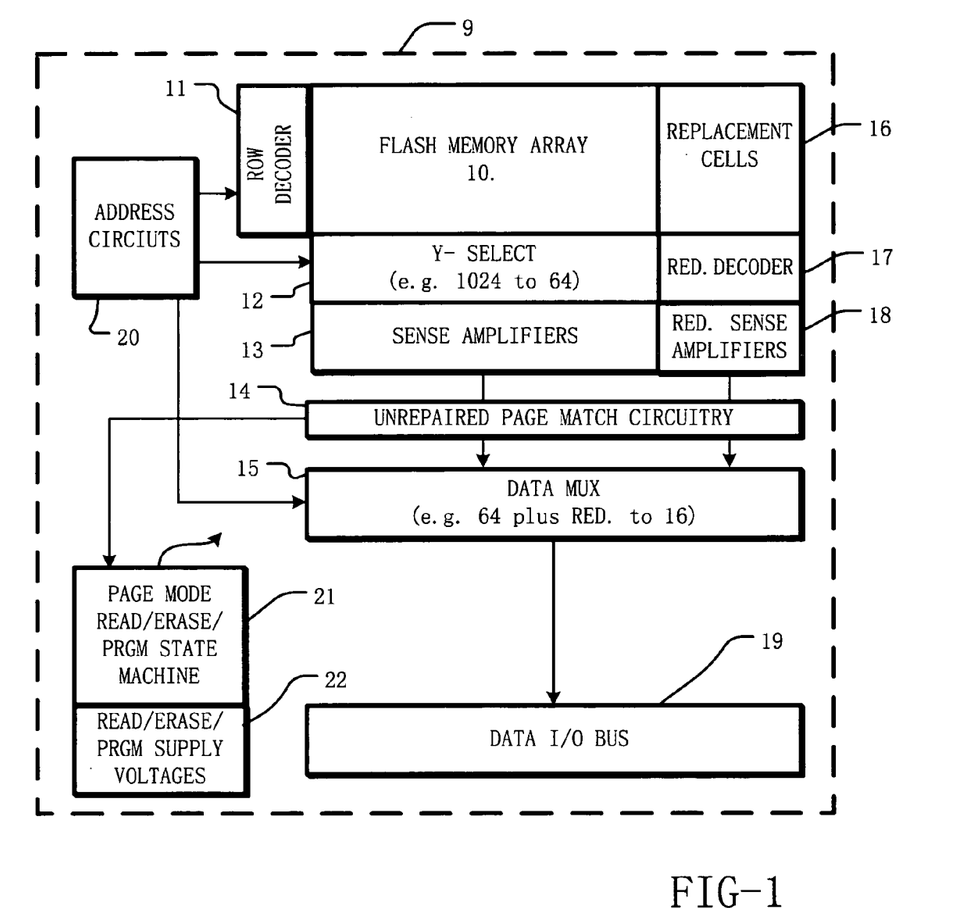
FIG. 1 is a block diagram of an integrated circuit device including page match circuitry for unrepaired pages.

FIG. 1 is a simplified block diagram of a single chip, integrated circuit memory device 9 supporting memory redundancy and page mode operations. The memory device 9 includes a flash memory array 10 that includes an array of memory cells typically organized into a plurality of sectors, and accessible using a plurality of bit lines and a plurality of word lines. A row decoder 11 is used for accessing selected word lines. A Y-select decoder 12 is used for accessing selected bit lines. A plurality of sense amplifiers 13, or other sensing circuitry, is coupled to data lines from the output of the Y-select decoder 12, and arranged to sense a page of data in parallel. In the illustrated example, a page of data includes 64-bits, which corresponds to four words, each of which includes two bytes that are 8 bits wide. Other embodiments include a greater number of data per page, including for example 512 bits per page or more. The sense amplifiers 13 temporarily store the data read during a read cycle using a page buffer or other memory structures. The outputs of the sense amplifiers 13 are applied to "unrepaired" page match circuitry 14, as described in more detail below, and to a data multiplexer 15. The data multiplexer 15 provides a repaired word as output to data input/output bus circuitry 19.

Memory redundancy is supported on the memory device 9 by resources including a set of replacement cells 16, the redundant decoder 17 for selecting replacement cells, and a set of redundant sense amplifiers 18, or other sensing circuitry, for temporarily storing and outputting the results sensed from selected replacement cells. The outputs from the redundant sense amplifiers 18 are applied to the "unrepaired" page match circuitry 14, as described in more detail below, and to the data multiplexer 15. The data multiplexer 15 replaces bits sensed from defective bit lines by bits sensed from the set of replacement cells.

Addressing circuits 20 are included on the memory device shown in FIG. 1. The addressing circuits 20 provide addresses to the row decoder 11, the Y-select decoder 12, and to the data multiplexer 15. Using techniques known in the art, addresses of defective bit lines are stored on the integrated circuit using for example nonvolatile memory cells that are programmed during testing of the integrated circuit. The addresses of defective bit lines act as indicators used by the addressing circuit 20 to reroute accesses to data bits stored in memory cells on defective bit lines into accesses to data stored in replacement cells.

A state machine 21 for page mode read, erase and program operations is included on the integrated circuit. In support of the operations of the state machine, read, erase and program supply voltages are generated and controlled by circuitry 22 on the circuit. The state machine comprises a processor executing instructions, dedicated logic, or a combination of a processor and dedicated logic.

The unrepaired page match circuitry 14 is configured to compare the output of the sense amplifiers 13 and the output of the redundant sense amplifiers 18 to a pattern, such as all 0's and/or all 1's, while masking data sensed from defective bit lines. In this manner, a verify result is generated using unrepaired page data combined with the output of the replacement cells. The verify result is applied to the state machine 21, and used for controlling program and erase operations. The operation of the unrepaired page match circuitry 14 on unrepaired page data is to be contrasted with other matching circuitry operating after repair of the output data using the replacement cells, such as would be available at the output of the data multiplexer 15 in the illustrated embodiment.

Figure 2:
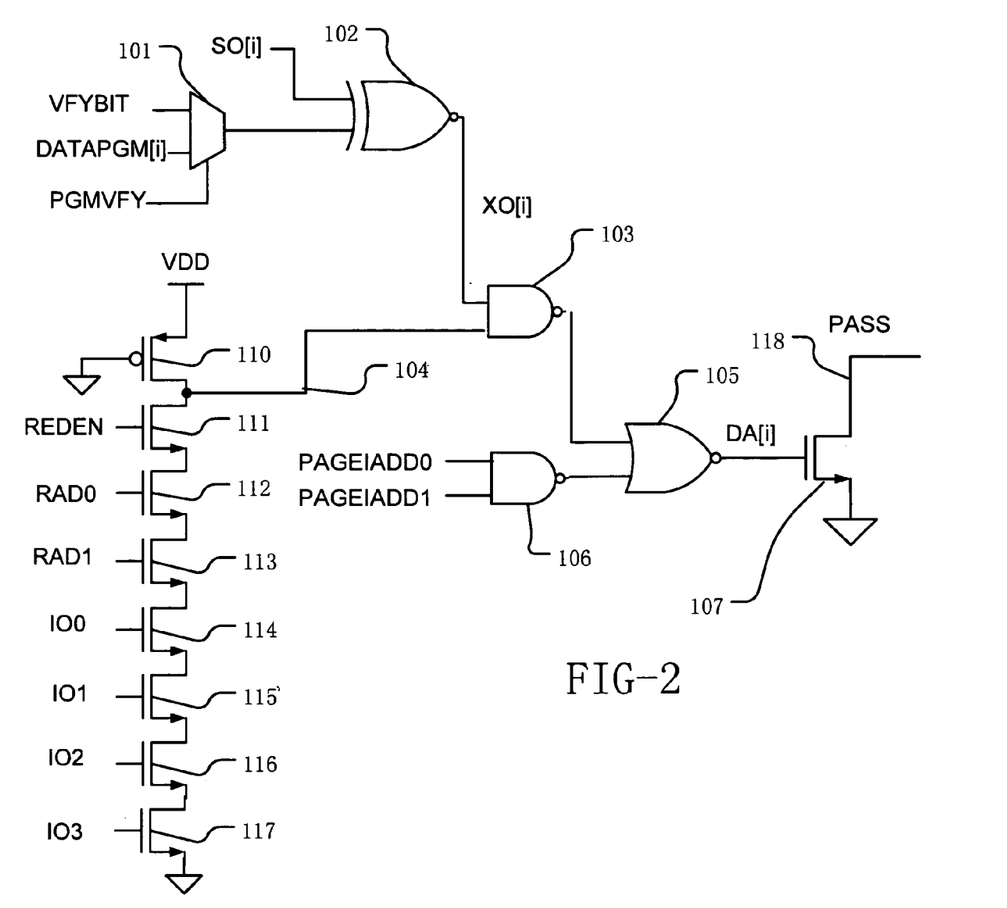
FIG. 2 is a circuit diagram for masking and comparing circuits, for unrepaired bits from a memory array.

FIG. 2 illustrates match circuitry for a corresponding bit line in the memory array. Data, labeled SO[i], from a corresponding bit line is applied on a data line output from a sense amplifier in the set of sense amplifiers as a first input to exclusive-OR gate 102. Pattern data is applied to the second input of the exclusive-OR gate 102 from the output of multiplexer 101. The inputs to the multiplexer include VFYBIT, used for verifying erase operations, and DATAPGM[i], used for verifying program operations. The control signal PGMVFY is used to control multiplexer 101. For erase operations, the VFYBIT is zero for all of the bits in the page. For pre-program operations, the DATAPGM[i] is one for all the bits in the page. For byte or word program operations, the pattern provided by DATAPGM[i] across the selected byte or word is equal to the data to be programmed. The output of the exclusive-OR gate 102 is applied as a first input to NAND-gate 103. The second input of the NAND-gate 103 is applied from node 104, from the replacement cells as discussed in more detail below. The output of the NAND-gate 103 is applied as a first input to NOR-gate 105. The second input of the NOR-gate 105 is applied from the output of NAND-gate 106. The inputs to the NAND-gate 106 include the address bits PAGEIADDR0 and PAGE-IADDR1 used for selecting one of four words internal to the four word page used in this embodiment. In other embodiments, outputs can be selected on byte boundaries, or on boundaries of other sub-page segments of data. The output of the NOR-gate 105 is a match result signal that is applied to the gate of n-channel transistor 107. The source of transistor 107 is applied to ground. The drain of transistor 107 is applied on line 118 and provides the comparison result to a wired-OR circuit described below with reference to FIG. 4. Node 104 is driven by the p-channel transistor 110 and the n-channel transistors 111–117, which are connected in series between the supply voltage VDD and ground. Transistor 110 has its gate coupled to ground and operates as a pull-up device between node 104 and the supply potential. Transistors 111–117 are connected in series between node 104 and ground, and operate like a seven input AND gate. The inputs to the transistors 111–117 include I/O information address IO0–IO3 which selects one of 16 bit lines in a word for replacement, repair address bits RAD0 and RAD1, which select one of four 16 bit line sets in a four word page for replacement, and the redundancy enable bit REDEN. REDEN is generated by address circuitry when the address matches a defective bit line. Therefore, the signal on node 104 indicates whether the bit line corresponding to SO[i] is defective. When the signal on line 104 is low, then the output of NAND-gate 103 is forced high, and the signal DA[i] on the gate of transistor 107 is forced low to mask the output of the pattern match circuit.

During page mode operations, the page internal address bits PAGEIADDR0 and PAGEIADDR1 are forced high, so that the output of NAND-gate 106 is low and does not mask the result. During a program operation on the word boundaries, the page internal address bits PAGEIADDR0 and PAGEIADDR1 indicate a selected word within the page. For bits that are outside of the selected word, the output of the NAND-gate 106 is forced high, which results in masking the output of the comparison result. For the selected word, the output of the NAND-gate 106 is low. Thus, the same matching circuitry can be used for page mode operations, as well as word boundary, or other sub-page segment, programming operations.

Figure 3:
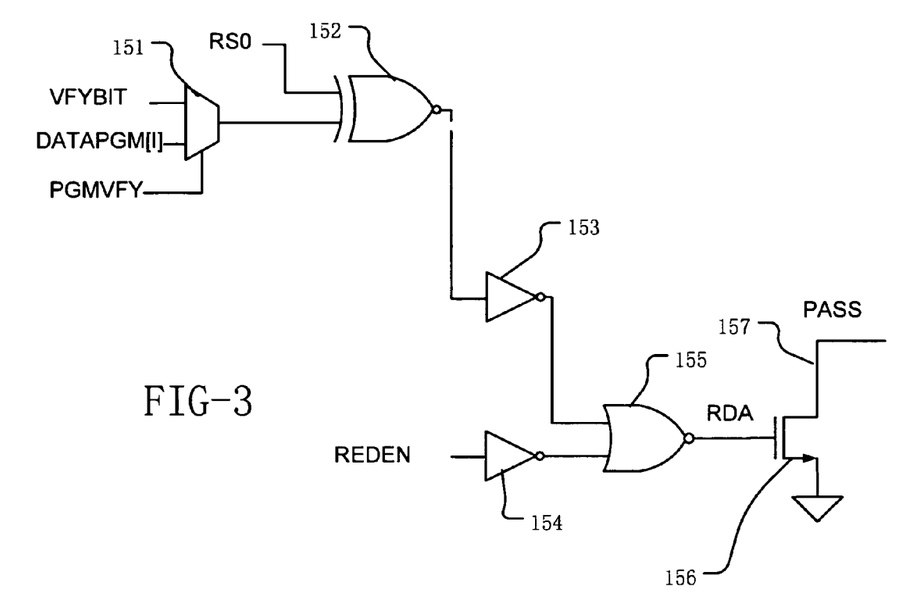
FIG. 3 is a circuit diagram for a comparing circuit for replacement bits sensed from a set of replacement cells.

FIG. 3 illustrates match circuitry for a corresponding bit line in the set of replacement cells for the memory array. Data, labeled RSO, from a corresponding replacement cell is applied on a data line output from a redundant sense amplifier in the set of redundant sense amplifiers, as a first input to exclusive-OR gate 152. Pattern data is applied to the second input of the exclusive-OR gate 152 from the output of multiplexer 151. The inputs to the multiplexer include VFYBIT, used for verifying erase operations, and DATAPGM[i], used for verifying program operations. The control signal PGMVFY is used to control multiplexer 151. For erase operations, the VFYBIT is zero for all of the bits in the page. For pre-program operations, the DATAPGM[i] is one for all the bits in the page. For byte or word program operations, the pattern provided by DATAPGM[i] across the selected byte or word is equal to the data to be programmed in the selected byte or word. The output of the exclusive-OR gate 152 is applied as an input to inverter 153. The output of the inverter 153 is applied as a first input to NOR-gate 155. The second input of the NOR-gate 155 is applied from the output of inverter 154. The input to the inverter 154 is the REDEN bit. The output of the NOR-gate 155 is a match result signal that is applied to the gate of n-channel transistor 156. The source of transistor 156 is applied to ground. The drain of transistor 156 is applied on line 157 and provides the comparison result to a wired-OR circuit described below with reference to FIG. 4. Thus the circuitry in FIG. 3 provides a comparison result for replacement cells in parallel with the comparison result from an unrepaired page that are provided by outputs from circuitry shown in FIG. 2.

Figure 4:
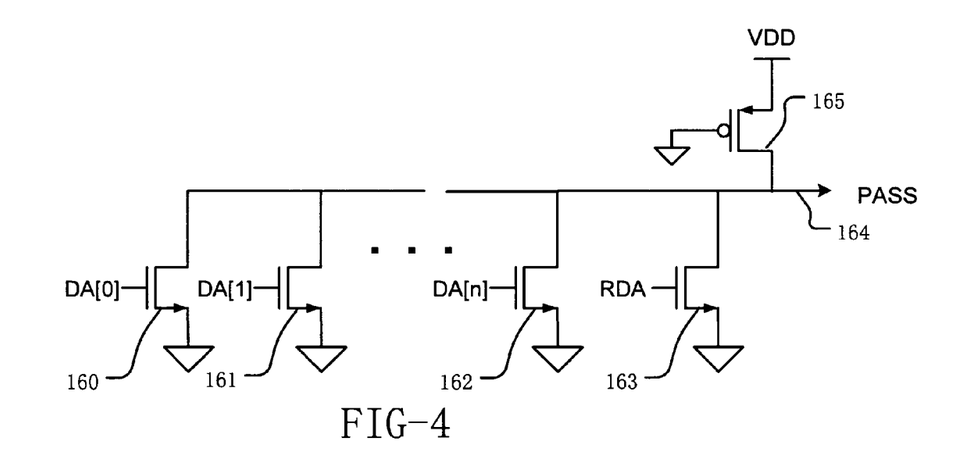
FIG. 4 is a circuit diagram indicating a wired-OR circuit for outputting a verify result based on the circuits of FIGS. 2 and 3.

FIG. 4 illustrates an embodiment of circuitry in which the outputs from the match circuitry shown in FIGS. 2 and 3 are combined in a wired-OR fashion. The match circuitry of FIG. 2 provides a pattern match result DA[i], where the index i goes from 0 to n, in a page having n+1 bits. The match circuitry of FIG. 3 outputs a pattern match result RDA for a replacement bit. The pattern match results DA[i], where the index i goes from 0 to n, and RDA are applied to respective n-channel transistors 160–163. The sources of the transistors 160–163 are coupled to ground. The drains of the transistors 160–163 are coupled to the node 164 in a wired-OR fashion. P-channel transistor 165, having its gate coupled to ground and its source coupled to the supply potential, and its drain coupled to the node 164, acts as a pull-up device. If any of the pattern match results DA[i], where the index i goes from 0 to n, and RDA is high, then the PASS signal on line 164 is pulled low. The PASS signal is applied to the state machine controlling the program or erase operation that utilizes the verify results. Thus, the PASS signal acts as a page verify signal generated before repair of a page that includes data from a defective bit line. This PASS signal can be used in program and erase operations to reduce the number of verify iterations required, and to increase the speed of page mode operations.

Figure 5:
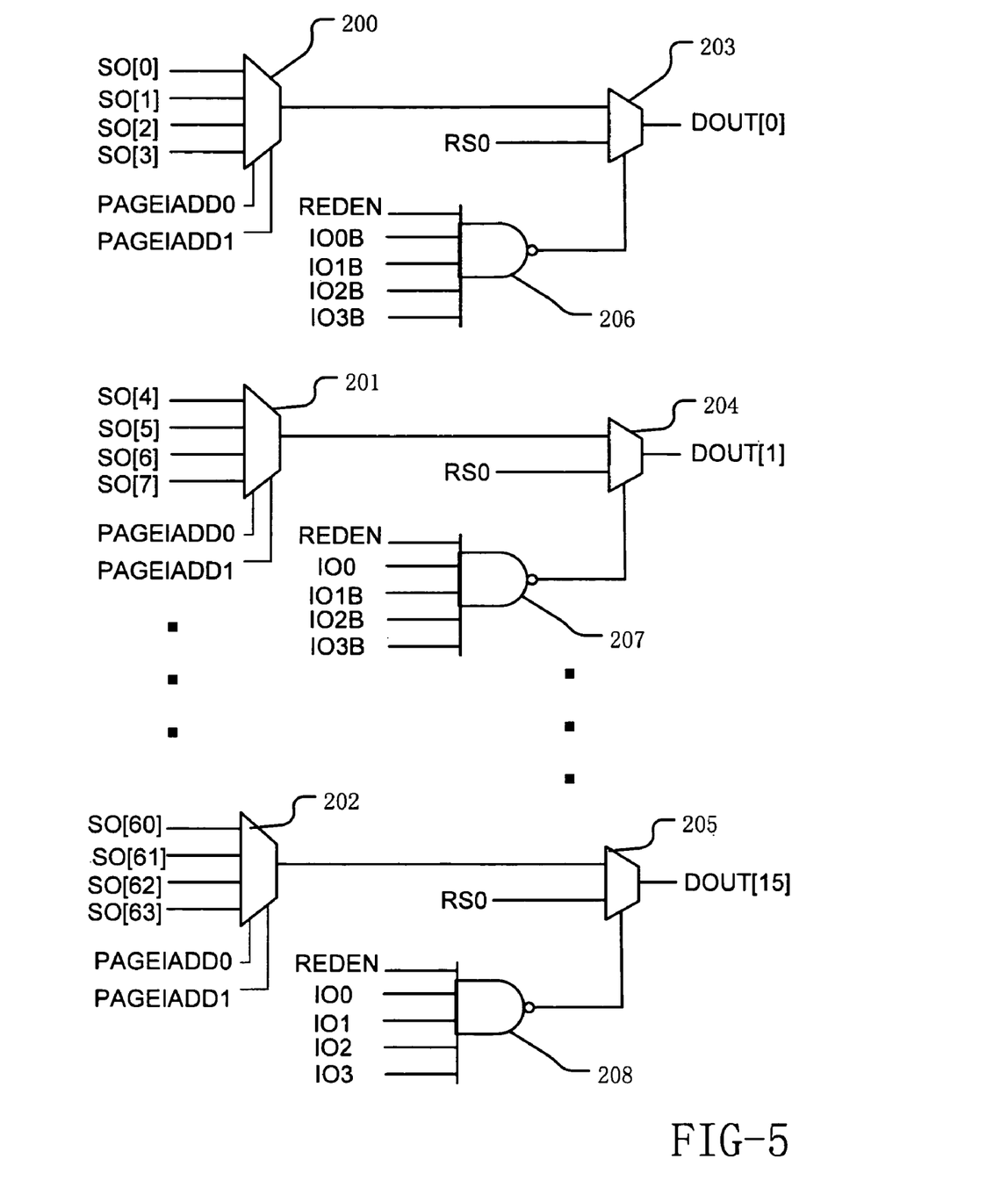
FIG. 5 is a circuit diagram for an output multiplexer which repairs words in a page mode memory device.

FIG. 5 illustrates data multiplexer circuitry used to repair data from an unrepaired page with output from replacement cells, suitable for use in the integrated circuit of FIG. 1. For a 64-bit page, the sense amplifier circuitry includes 64 sense amplifier outputs on data lines labeled SO[0] to SO[63]. Sixteen sets of four sense amplifier outputs (<SO[0]–SO[3]>, <SO[4]–SO[7]>, . . . , <SO[60]–SO[63]>) are applied to respective multiplexers 200, 201, 202. The multiplexers 200, 201, 202 are controlled by the page internal address bits PAGEIADDR0 and PAGEIADDR1 to select one of four sense amplifier outputs, for output to a corresponding replacement multiplexer 203, 204, 205. A second input to the replacement multiplexer 203, 204, 205 is the output RSO of a redundant sense amplifier used for replacing a bit from a defective bit line in the array. The replacement multiplexers 203, 204, 205 are controlled by a signal on the output of a corresponding NAND-gate 206, 207, 208. Inputs to the NAND-gate 206, 207, 208 include the redundant enable bit REDEN and address signals IO0–IO3. The NAND-gate decodes which of the 16 replacement multiplexers is to use the replacement bit for RSO. Thus, the inputs to the NAND-gate 206 include IO0B, IO1B, IO2B and IO3B, enabling selection of RSO by multiplexer 203 when IO0–IO3 are <0000>. Thus, the inputs to the NAND-gate 207 include IO0, IO1B, IO2B and IO3B, enabling selection of RSO by multiplexer 203 when IO0–IO3 are <1000>. The inputs to the NAND-gate 208 include IO0, IO1, IO2 and IO3, enabling selection of RSO by multiplexer 205 for supply as DOUT[15], when IO0–IO3 are <1111>. Therefore, unrepaired 64-bit page SO[i] is applied as input to the data multiplexer, and selected, repaired 16-bit words are output.

Figure 6:
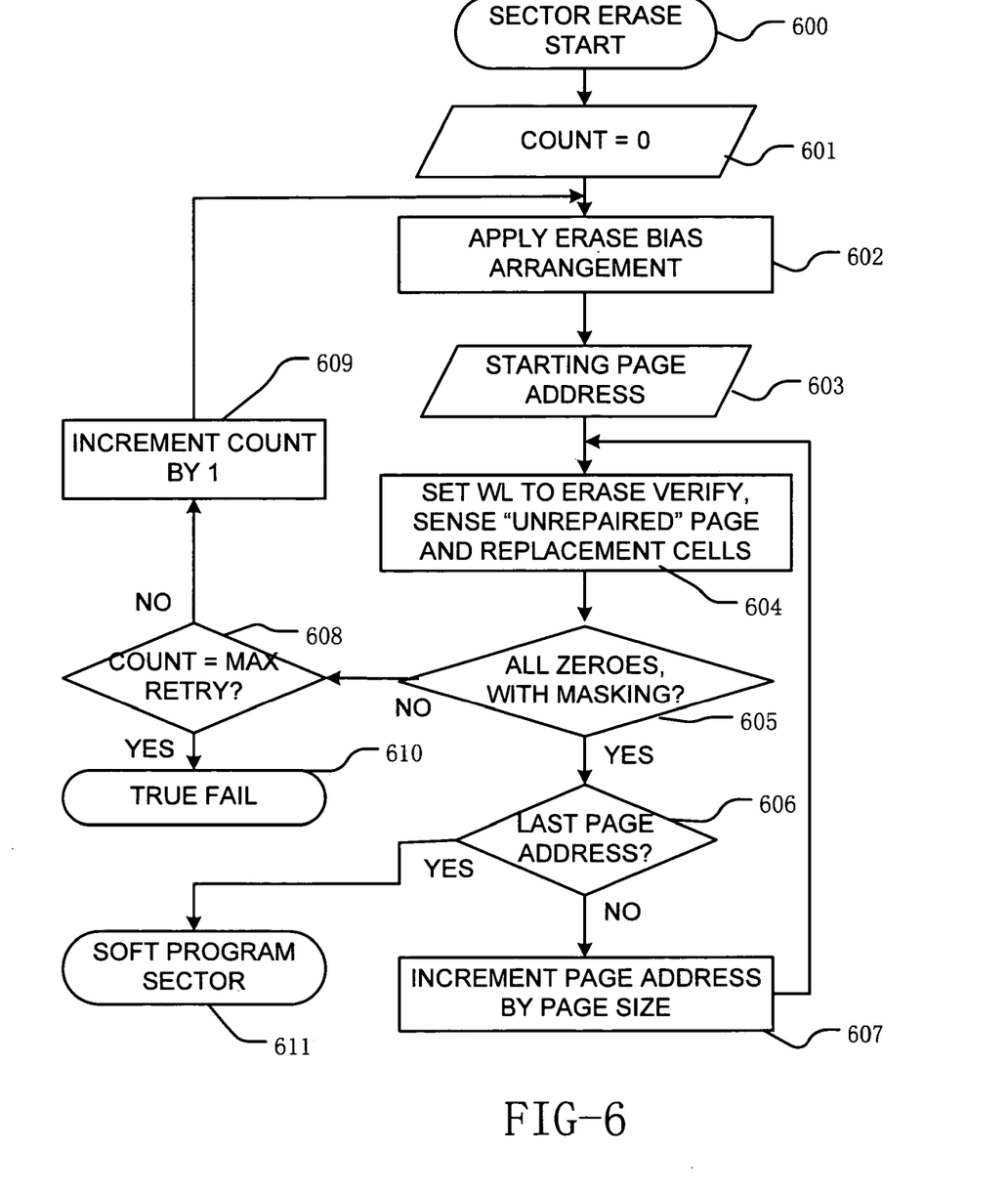
FIG. 6 is a flow chart for a sector erase procedure for a page mode memory device, utilizing unrepaired page match results.

FIG. 6 is a flow chart for a sector erase operation, representative of biasing procedures with page mode verify operations, implemented by state machines or other logic circuitry, such as that shown in the integrated circuit memory of FIG. 1. The sector erase operation starts at block 600 with a sector erase command. A retry count value is set to zero in block 601. An erase bias arrangement suitable for the memory cells in the array is applied to the sector in block

602. After recovering from the erase bias voltages, a verify operation begins at a starting page address (block 603). The word line for the starting page address is set to an erase verify voltage level, and the "unrepaired" page data is sensed. In parallel with sensing the unrepaired page data, the output of replacement cells is sensed for defective bit lines (block 604). Next, the verify result is tested. In this example, the verify result looks for matching a pattern of all zeros in the unrepaired page and in the replacement cells, while masking bits within the page that are sensed from a defective bit line (block 605). If the verify result is true, then the algorithm determines whether the last page address has been verified within the sector (block 606). If the last page address has been verified, then the algorithm proceeds to a soft program operation (block 611) in this representative embodiment. If at block 606, the last page address had not been verified, then the page address is incremented by a page size (block 607), and the algorithm returns to block 604 to verify a next page. If the verify result sensed at block 605 is not true, then the algorithm branches to determine whether the retry count value is equal to a maximum retry parameter (block 608). If the maximum retry parameter has not been reached, then the count is incremented (block 609), and the algorithm returns to block 602 to retry the erase bias arrangement for the sector. If the maximum retry parameter had been reached at block 608, then failure is indicated (block 610). Thus, the procedure allows for page mode verify operations which are stepped by page sizes, rather than byte-by-byte or word-by-word. This significantly increases the speed of a sector erase procedure.

Figure 7:
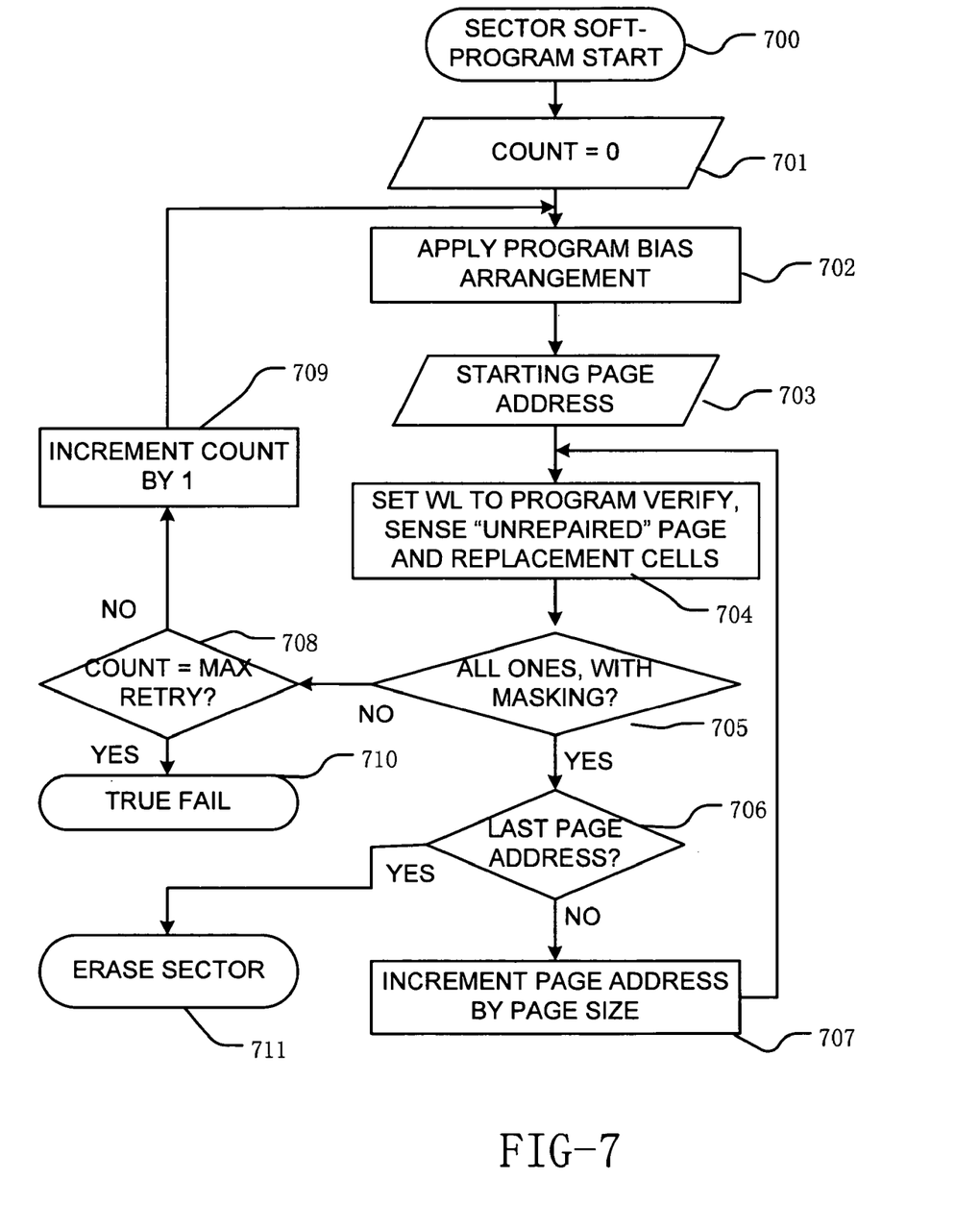
FIG. 7 is a flow chart for a sector pre-program and erase procedure for a page mode memory device, utilizing unrepaired page match results.

In some embodiments, a pre-program operation is executed prior to sector erase. The pre-program operation benefits from the page mode verify operations as well. A representative pre-program operation is illustrated in FIG. 7. The sector pre-program operation starts at block 700 after a sector erase command. A retry count value is set to zero in block 701. A program bias arrangement suitable for the memory cells in the array is applied to the sector in block 702. After recovering from the program bias voltages, a verify operation begins at a starting page address (block 703). The word line for the starting page address is set to a program verify voltage level, and the "unrepaired" page data is sensed. In parallel with sensing the unrepaired page data, the output of replacement cells is sensed for defective bit lines (block 704). Next, the verify result is tested. In this example, the verify result looks for matching a pattern of all ones in the unrepaired page and in the replacement cells, while masking bits within the page that are sensed from a defective bit line (block 705). If the verify result is true, then the algorithm determines whether the last page address has been verified within the sector (block 706). If the last page address has been verified, then the algorithm proceeds to a sector erase operation (block 711) like that of FIG. 6. If at block 706, the last page address has not been verified, then the page address is incremented by a page size (block 707), and the algorithm returns to block 704 to verify a next page. If the verify result at block 705 is not true, then the algorithm branches to determine whether the retry count value is equal to a maximum retry parameter (block 708). If the maximum retry parameter has not been reached, then the count is incremented (block 709) and the algorithm returns to block 702 to retry the pre-program bias arrangement for the sector. If the maximum retry parameter had been reached at block 708, then failure is indicated (block 710). Thus, the procedure allows for page mode verify operations which are stepped by page sizes, rather than byte-by-byte or word-by-word. This page-by-page verify process, using unrepaired page data, significantly increases speed of the sector pre-preprogram and erase procedure.

The present invention provides a flash memory having a shortened erasing operation time. In embodiments of the technology described, there is provided a flash memory comprising nonvolatile memory cells, arranged as an array of a plurality of sectors, each sector supporting concurrent read and verify based on unrepaired page data. The pages described above include 64 bits. Other embodiments include pages with more or fewer bits as discussed above, that are sensed in parallel, and comprise more than one word.

Page verify of the flash memory shortens pre-program verify, erase verify and soft-program verify time to 1/N of the original time needed compared to the word-by-word verify scheme, wherein N is the count of words in a page. Total erase time is therefore significantly improved, particularly for large page operations. A simplified computation is provided to illustrate the potential savings in time provided by the page mode verify described herein. Commonly, erase time=pre-program time+pre-program verify time+erase time+erase verify time+soft program time+retry times. In some cases, soft program verify time is needed as well.

For an example of improvement available, assume a prior art arrangement with 110 ms for pre-program, 150 ms for erase, 192 ms for soft program, retry pre-program 10 ms, retry erase 10 ms. Word mode erase verify time can consume 200 ns for a word. Assume one sector is erased, with 32 k words in a sector.

If at each phase no retry action occurs, total verify time would be 13.2 ms (6.5 ms for pre-program verify, 6.5 ms for erase verify for each sector), which amounts to about 2.7 percent in the whole erase time (110+150+192+13.2). If the chip supports pre-program and erase functions for several sectors at the same time, then the verify time would occupy more time, suppose 4 sectors could be done at the same time, then perhaps verify would occupy about 5% to the total time (4*13.2=52.8 ms for verify time, 110+150+192+52.8=1080.8 for total erase time). But if retries are executed, additional program verify and erase verify processes are needed, and additional time is needed for the process.

Now, erase time with unrepaired page verify as described herein is much less. The verify function occupies a much lower percentage in the whole flow. In the scheme of FIG. 1, which supports verify of four words at the same time, assuming the same timing parameters as above, only one quarter of the verify time is needed, or 3.3 ms, for one sector verify operation, if no retry action occurs, occupying only about 0.6% of the erase time. Efficiency is also improved when retry occurs.

From the calculation above, efficiency improvements are apparent for an erase without retry operations. The improvements are multiplied in retry cycles. In page-mode or burst-mode flash memory devices supporting a suspend-resume function, the page mode verify can have dramatic effects because of the chance that verify operations multiply. For example, in some applications of flash memory, a customer can issue suspend commands during an erase phase to read data from other blocks of the flash chip. After the suspend function finished, a resume command is issued to continue the erase function. Commonly, in supporting such functions, the internal state machine resumes the erase at the verify phase (pre-program verify if suspend at pre-program, erase verify phase if suspend at erase phase). The efficiency improvement for multi-sector erase with a large number of suspend/resume commands in this case can be dramatic. For example, 1000 suspend/resume commands could be issued during a 4-sector erase process, causing an extra 1000 verify operations. The page mode verify operation described herein can result in significant time savings in these circumstances.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. An integrated circuit, comprising:
   an array of memory cells, including a plurality of bit lines and a plurality of word lines;
   a set of replacement cells configured to provide replacements for defective memory cells in the array;
   sense circuitry which senses a page of data in parallel from the array, wherein a page comprises a plurality of words, and which senses one or more bits from the set of replacement cells; and
   match circuitry coupled to the sense circuitry and to the set of replacement cells, which determines in parallel whether bits in the page combined with the one or more bits from the set of replacement cells match a pattern, including circuitry to mask bit lines coupled to defective cells in the array.

2. The circuit of claim 1, wherein the sense circuitry includes a page buffer arranged to sense the page of data in parallel from the plurality of bit lines.

3. The circuit of claim 1, wherein the sense circuitry includes a set of sense amplifiers arranged to sense the page of data in parallel from the plurality of bit lines.

4. The circuit of claim 1, wherein the pattern used in the match circuitry is changeable.

5. The circuit of claim 1, wherein the match circuitry includes circuits to set the pattern as all 1's, and as all 0's for verifying pre-program and erase operations.

6. The circuit of claim 1, wherein the pattern includes data to be programmed, and match circuitry includes circuits operable to execute program operations for a sub-page segment to mask bits not in the sub-page segment in the page during program verify.

7. The circuit of claim 1, wherein the match circuitry is coupled to a set of data lines for a page of data bits from the array and to data lines for the set of replacement cells, and includes a corresponding set of masking and comparing circuits coupled to respective data lines, the masking and comparing circuits respectively comprising:
   logic to indicate whether the data bit from a corresponding bit line from the array is defective,
   logic to compare the data bit with a bit from the pattern to produce a comparison result, and
   logic to force the comparison result to indicate a match if the corresponding bit line is defective.

8. The circuit of claim 1, wherein the match circuitry is coupled to a set of data lines for a page of data bits from the array and to data lines for the set of replacement cells, and includes a corresponding set of masking and comparing circuits coupled to respective data lines, the masking and comparing circuits respectively comprising:
   logic to indicate whether the data bit from a corresponding bit line from the array is defective,
   logic to compare the data bit with a bit from the pattern to produce a comparison result, and
   logic to force the comparison result to indicate a match if the corresponding bit line is defective, and during a program operation for a selected sub-page segment in the page, to force the comparison result to indicate a match if the corresponding bit is not in the selected sub-page segment.

9. The circuit of claim 1, wherein the match circuitry is coupled to a set of data lines for a page of data bits from the array, and includes a corresponding set of masking and comparing circuits coupled to respective data lines, the masking and comparing circuits having outputs arranged in a wired-OR fashion to output a match result.

10. The circuit of claim 1, including logic to execute a sector program operation, including
    applying program bias voltages to cells in a sector of the array, and to one or more cells in the set of replacement cells, to program the sector to a program pattern; and
    verifying the sector program pattern by sequencing through pages in the sector by applying a verify bias voltage to a word line for a current page in the sector and to the one or more cells in the set of replacement cells, and if the match circuitry indicates a match with the program pattern, then proceeding to a next page until all pages in the sector pass verify, and if the match circuitry does not indicate a match on the current page, then retrying the step of applying program bias voltages until a match is indicated before proceeding to the next page, or until a maximum number of retries is reached indicating failure.

11. The circuit of claim 1, including logic to execute a sector erase operation, including:
    applying erase bias voltages to cells in a sector of the array, and to one or more cells in the set of replacement cells, to program the sector to an erase pattern;
    verifying the sector erase pattern by sequencing through pages in the sector by applying a verify bias voltage to a word line for a current page in the sector and to the one or more cells in the set of replacement cells, and if the match circuitry indicates a match with the erase pattern, then proceeding to a next page until all pages in the sector pass verify, and if the match circuitry does not indicate a match on the current page, then retrying the step of applying erase bias voltages until a match is indicated before proceeding to the next page, or until a maximum number of retries is reached indicating failure.

12. The circuit of claim 1, including logic to execute a sector erase operation, including:
    applying pre-program bias voltages to cells in a sector of the array, and to one or more cells in the set of replacement cells, to program the sector to a pre-program pattern;
    verifying the sector pre-program pattern by sequencing through pages in the sector by applying a verify bias voltage to a word line for a current page in the sector and to the one or more cells in the set of replacement cells, and if the match circuitry indicates a match with the pre-program pattern, then proceeding to a next page until all pages in the sector pass verify, and if the match circuitry does not indicate a match on the current page, then retrying the step of applying program bias voltages until a match is indicated before proceeding to the next page, or until a maximum number of retries is reached indicating failure;
    if pre-programming is successful, then applying erase bias voltages to cells in a sector of the array, and to one or more cells in the set of replacement cells, to program the sector to an erase pattern; and verifying the sector erase pattern by sequencing through pages in the sector by applying a verify bias voltage to a word line for a current page in the sector and to the one or more cells in the set of replacement cells, and if the match circuitry indicates a match with the erase pattern, then proceeding to a next page until all pages in the sector pass verify, and if the match circuitry does not indicate a match on the current page, then retrying the step of applying erase bias voltages until a match is indicated before proceeding to the next page, or until a maximum number of retries is reached indicating failure.

13. A method for operating a nonvolatile memory device, comprising:

applying a biasing procedure to a sector of memory cells in a memory array;

sensing a page of data from the sector on a plurality of bit lines in the memory array and one or more bits from a set of replacement cells in parallel, wherein one or more bit lines in the plurality of bit lines is marked defective;

matching the page of data and the one or more bits with a pattern in parallel to indicate a verify result, while masking data from one or more bit lines marked defective.

14. The method of claim 13, including using a first pattern in the matching step for an erase operation, and applying a second pattern in the matching step for a program operation, wherein the first and second patterns are different.

15. The method of claim 13, including using a pattern of all 0's in the matching step for one of an erase operation and a program operation, and using a pattern of all 1's in the matching step for the other of the erase operation and the program operation.

16. The method of claim 13, wherein the biasing procedure includes an operation to program a sub-page segment within a page, and the pattern comprises data to be programmed, and including masking data in the page that is outside the sub-page segment during the matching.

17. The method of claim 13, including executing a sector program operation, including:

applying program bias voltages to cells in a sector of the array, and to one or more cells in the set of replacement cells, to program the sector to a program pattern;

verifying the sector program pattern by sequencing through pages in the sector by applying a verify bias voltage to a word line for a current page in the sector and to the one or more cells in the set of replacement cells, and if the verify result indicates a match with the program pattern, then proceeding to a next page until all pages in the sector pass verify, and if the verify result does not indicate a match on the current page, then retrying the step of applying program bias voltages until a match is indicated before proceeding to the next page, or until a maximum number of retries is reached indicating failure.

18. The method of claim 13, including executing a sector erase operation, including:

applying erase bias voltages to cells in a sector of the array, and to one or more cells in the set of replacement cells, to program the sector to an erase pattern;

verifying the sector erase pattern by sequencing through pages in the sector by applying a verify bias voltage to a word line for a current page in the sector and to the one or more cells in the set of replacement cells, and if the verify result indicates a match with the erase pattern, then proceeding to a next page until all pages in the sector pass verify, and if the verify result does not indicate a match on the current page, then retrying the step of applying erase bias voltages until a match is indicated before proceeding to the next page, or until a maximum number of retries is reached indicating failure.

19. The method of claim 13, including executing a sector erase operation, including applying pre-program bias voltages to cells in a sector of the array, and to one or more cells in the set of replacement cells, to program the sector to a pre-program pattern;

verifying the sector pre-program pattern by sequencing through pages in the sector by applying a program verify bias voltage to a word line for a current page in the sector and to the one or more cells in the set of replacement cells, and if the verify result indicates a match with the pre-program pattern, then proceeding to a next page until all pages in the sector pass verify, and if the verify result does not indicate a match on the current page, then retrying the step of applying program bias voltages until a match is indicated before proceeding to the next page, or until a maximum number of retries is reached indicating failure;

if pre-programming is successful, then applying erase bias voltages to cells in the sector of the array, and to one or more cells in the set of replacement cells, to erase the sector to an erase pattern; and verifying the sector erase pattern by sequencing through pages in the sector by applying an erase verify bias voltage to a word line for a current page in the sector and to the one or more cells in the set of replacement cells, and if the verify result indicates a match with the erase pattern, then proceeding to a next page until all pages in the sector pass verify, and if the verify result does not indicate a match on the current page, then retrying the step of applying erase bias voltages until a match is indicated before proceeding to the next page, or until a maximum number of retries is reached indicating failure.

20. An integrated circuit, comprising:

an array of non-volatile, charge storage memory cells, including a plurality of bit lines and a plurality of word lines;

a set of replacement cells configured to provide replacements for defective memory cells in the array;

circuitry indicating defective bit lines in the array;

sense circuitry which senses a page of data in parallel from the array, wherein a page comprises a plurality of words, and which senses one or more bits from the set of replacement cells;

match circuitry coupled to the sense circuitry and to the set of replacement cells, which determines in parallel whether bits in the page combined with the one or more bits from the set of replacement cells match a pattern, including circuitry to mask defective bit lines; and an output multiplexer coupled to the sense circuitry which selects words from the page, and replaces bits in the words sensed from defective bit lines with replacement bits from the set of replacement cells for output.

21. The circuit of claim 20, wherein the sense circuitry includes a page buffer arranged to sense the page of data in parallel from the plurality of bit lines.

22. The circuit of claim 20, wherein the sense circuitry includes a set of sense amplifiers arranged to sense the page of data in parallel from the plurality of bit lines.

23. The circuit of claim 20, wherein the match circuitry includes circuits to set the pattern as all 1's, and as all 0's for verifying both pre-program and erase operations.

24. The circuit of claim 20, wherein the pattern includes data to be programmed, and match circuitry includes circuits operable to execute program operations for a sub-page segment to mask bits not in the sub-page segment in the page during program verify.

25. The circuit of claim 20, wherein the match circuitry is coupled to a set of data lines for a page of data bits from the array and to data lines for the set of replacement cells, and includes a corresponding set of masking and comparing circuits coupled to respective data lines, the masking and comparing circuits respectively comprising:
   logic to indicate whether the data bit from a corresponding bit line from the array is defective,
   logic to compare the data bit with a bit from the pattern to produce a comparison result, and
   logic to force the comparison result to indicate a match if the corresponding bit line is defective.

26. The circuit of claim 20, wherein the match circuitry is coupled to a set of data lines for a page of data bits from the array and to data lines for the set of replacement cells, and includes a corresponding set of masking and comparing circuits coupled to respective data lines, the masking and comparing circuits respectively comprising:
   logic to indicate whether the data bit from a corresponding bit line from the array is defective,
   logic to compare the data bit with a bit from the pattern to produce a comparison result, and
   logic to force the comparison result to indicate a match if the corresponding bit line is defective, and during a program operation for a selected sub-page segment in the page, to force the comparison result to indicate a match if the corresponding bit is not in the selected sub-page segment.

27. The circuit of claim 20, wherein the match circuitry is coupled to a set of data lines for a page of data bits from the array, and includes a corresponding set of masking and comparing circuits coupled to respective data lines, the masking and comparing circuits having outputs arranged in a wired-OR fashion to output a match result.

28. The circuit of claim 20, including logic to execute a sector erase operation, including:
   applying pre-program bias voltages to cells in a sector of the array, and to one or more cells in the set of replacement cells, to program the sector to a pre-program pattern;
   verifying the sector pre-program pattern by sequencing through pages in the sector by applying a verify bias voltage to a word line for a current page in the sector and to the one or more cells in the set of replacement cells, and if the match circuitry indicates a match with the pre-program pattern, then proceeding to a next page until all pages in the sector pass verify, and if the match circuitry does not indicate a match on the current page, then retrying the step of applying program bias voltages until a match is indicated before proceeding to the next page, or until a maximum number of retries is reached indicating failure;
   if pre-programming is successful, then applying erase bias voltages to cells in a sector of the array, and to one or more cells in the set of replacement cells, to program the sector to an erase pattern; and
   verifying the sector erase pattern by sequencing through pages in the sector by applying a verify bias voltage to a word line for a current page in the sector and to the one or more cells in the set of replacement cells, and if the match circuitry indicates a match with the erase pattern, then proceeding to a next page until all pages in the sector pass verify, and if the match circuitry does not indicate a match on the current page, then retrying the step of applying erase bias voltages until a match is indicated before proceeding to the next page, or until a maximum number of retries is reached indicating failure.

* * * * *